Figure 2A:
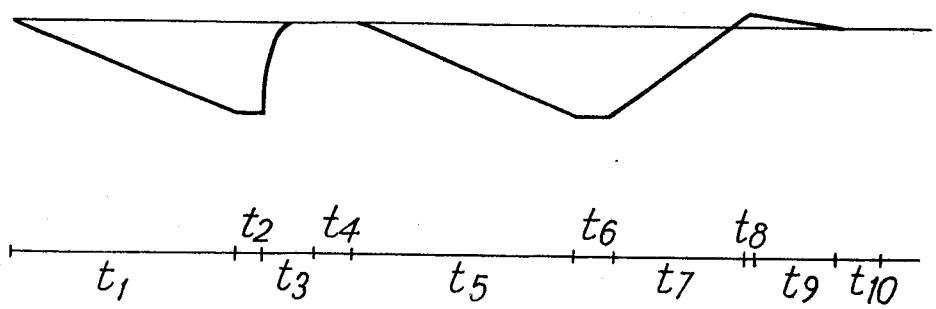

United States Patent [19]
Peattie

[11] 3,943,506
[45] Mar. 9, 1976

[54] MULTIPLE RAMP DIGITISERS

[75] Inventor: Richard Challinor Peattie, Tarnham, England

[73] Assignee: The Solartron Electronic Group Limited, Farnborough, England

[22] Filed: Dec. 21, 1973

[21] Appl. No.: 427,186

[52] U.S. Cl. ................... 340/347 NT; 340/347 AD
[51] Int. Cl.² .................................... H03K 13/20
[58] Field of Search ............. 340/347 AD, 347 NT; 324/99 D

[56] References Cited
UNITED STATES PATENTS

| | | | |
|---|---|---|---|
| 3,703,002 | 11/1972 | Van Saun | 340/347 AD |
| 3,737,892 | 6/1973 | Dorey | 340/347 NT |
| 3,737,893 | 6/1973 | Belet et al. | 340/347 NT |
| 3,747,089 | 7/1973 | Sharples | 340/347 NT |
| 3,750,146 | 7/1973 | Lucas | 340/347 AD |

Primary Examiner—Charles D. Miller
Attorney, Agent, or Firm—William R. Sherman; Stewart F. Moore

[57] ABSTRACT

This invention relates to electronic analogue to digital converters of the integrating type wherein a capacitor is successively charged by an input signal and discharged by a reference signal, the time required for discharge serving as a measure of the amplitude of the input signal.

The invention provides a converter wherein the integrator has differential inputs and the control means applies successively the input signal and the reference signal to the same input of the integrator if these signals are of different polarity, but successively to different ones of the differential inputs if input signal and reference signal are of the same polarity.

The invention has application in measuring positive or negative input signals whilst employing a single principal reference signal and may be used advantageously in digital voltmeters for making d.c. measurements in the presence of interference.

7 Claims, 3 Drawing Figures

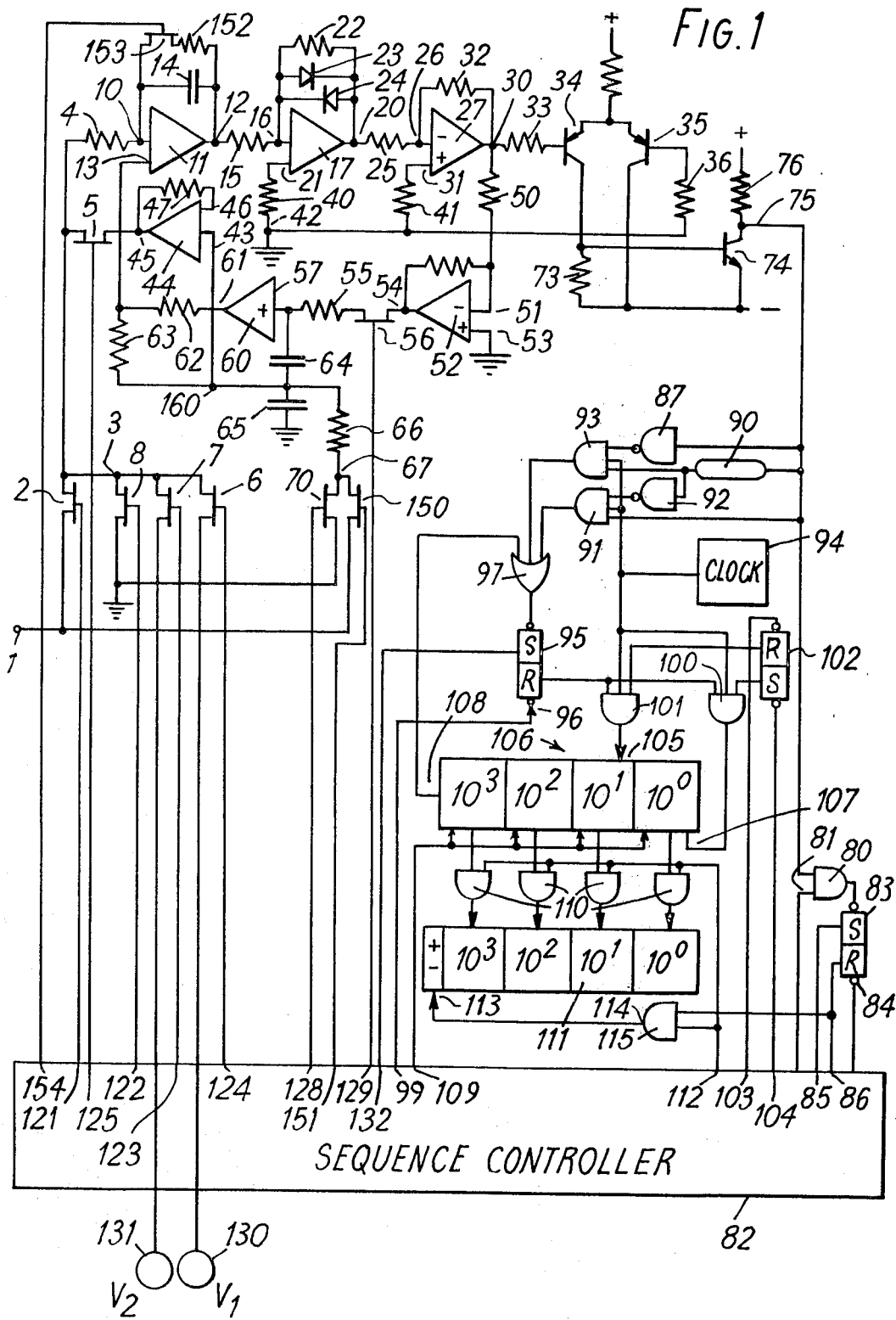

+VE SIGNAL $t_1$ $t_2$ $t_3$ $t_4$ $t_5$ $t_6$ $t_7$ $t_8$ $t_9$ $t_{10}$

−VE SIGNAL

MULTIPLE RAMP DIGITISERS

This invention relates to analogue to digital converters of the integrating type and is particularly, but not exclusively, concerned with the use of such analogue to digital converters in digital voltmeters.

This class of converts includes "dual ramp" converters which are now widely known and used and whereof a description in the context of current state of the art is to be found, for example, at page 227 et seq of "Electronic Measurements and Instrumentation" published by the McGraw Hill book company. It also includes "triple ramp" voltmeters such as are described in our U.S. Pat. No. 3678506 and it will be understood that in principle a larger number of ramps might be employed.

Known converters of this class typically provide, for the measurement of signals of either polarity, dual reference sources of equal voltage but opposite polarity; it is an object of the invention to avoid the need for such dual equal reference sources and the expense associated therewith.

According to the invention, an analogue to digital converter of the integrating type for providing a digital output signal representative of the magnitude of an analogue input signal comprises
an input terminal for receiving an input signal,
an integrating capacitor,
a charging circuit having first and second inputs and arranged to supply a charging current to the integrating capacitor, the polarity of the charging current being the same as that of a signal applied to said first input and opposite to that of a signal applied to said second input,
polarity testing means arranged to receive a signal representative of the input signal for testing the polarity of the input signal and providing an output signal representative of said polarity,
a source of at least one reference signal,
first switch means for establishing a signal path between the input terminal and one of said inputs of the charging circuit,
second switch means for establishing a signal path between the source of reference voltage and one of said inputs of the charging circuit; wherein said second switch means is arranged to apply the reference signal to a predetermined one of said inputs of the charging circuit irrespective of the polarity of the input signal and the first switch means is responsive to the signal representative of said polarity to establish a signal path between the input terminal and said predetermined one of said inputs of the charging circuit if the input signal and the reference signal are of different polarity and to establish a signal path between the input terminal and the other one of said inputs of the charging circuit from the reference signal if the input signal and the reference signal are of the same polarity, whereby the charge acquired by the capacitor from the charging circuit during application of the input signal is dependent upon the magnitude of the input signal, and is discharged by the application of the reference signal,
clock pulse generator means and,
pulse counting means for counting clock pulses during the application of the reference signal whereby to provide a digital output signal representative of the magnitude of the input signal.

The invention will now be described by way of non-limitative example with reference to the accompanying drawings in which FIG. 1 is a block circuit diagram of a digital voltmeter in accordance with one aspect of the invention.

Figure 2B:
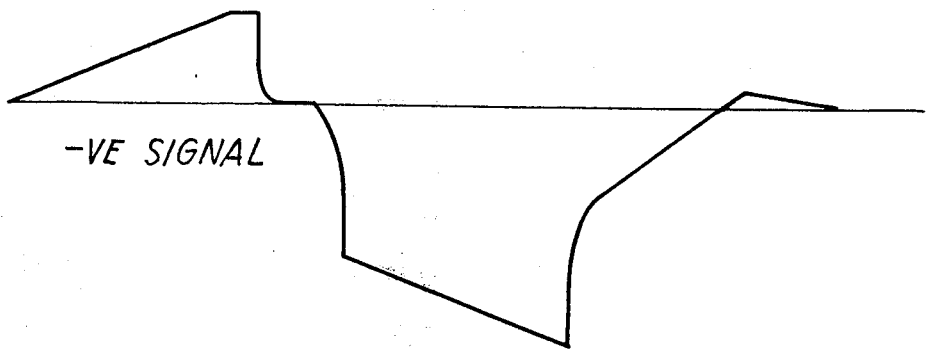

FIGS. 2a and 2b show the voltage waveforms at a point in the circuit of FIG. 1 under different operating conditions of the circuit.

Referring now to FIG. 1 an input terminal 1 is connected through a solid state switch 2 to a circuit point 3 and through a solid state switch 150 to a circuit point 67. Circuit point 3 is in turn connected to switches 5, 6, 7 and 8, and via resistor 4, to the inverting input 10 of a differential amplifier 11 which also has an output 12 and a non-inverting input 13. A resistance 152 in series with a switch 153 is connected in parallel with a capacitor 14 which is connected between the output 12 and the inverting input 10 of amplifier 11.

The output 12 is connected through resistance 15 to the inverting input 16 of a differential amplifier 17. Amplifier 17 has an output terminal 20 and a non-inverting input 21. A resistance 22 and two oppositely directed diodes 23 and 24 are connected in parallel with each other between the output 20 and the inverting input 16, so that amplifier 17 acts as a limiting amplifier.

The output 20 is connected through resistance 25 to the inverting input 26 of differential amplifier 27 which has an output 30 and a non-inverting input 31.

The output 30 is connected through a feedback resistance 32 to the inverting input 26 so that the amplifier 27 provides further gain. The output 30 is also connected through a resistance 33 to the base of transistor 34 which is connected with transistor 35 in long-tailed configuration.

The non-inverting inputs 21 and 31 of amplifiers 17 and 27 respectively are connected through respective resistances 40 and 41 to a common circuit point 42. Resistance 36 is connected between circuit point 42 and the base of transistor 35. Circuit point 42 is connected to ground.

The output 30 of amplifier 27 is also connected through resistance 50 to the inverting input 51 of an amplifier 52 the non-inverting input 53 of which is connected to ground. The output 54 of amplifier 52 is connected through switch 56 and a resistance 55 to the non-inverting input 57 of an amplifier 60. The output 61 of amplifier 60 is connected to a potential divider formed by resistances 62 and 63 in series, the common junction of these resistances being connected to the non-inverting input 13 of amplifier 11 and the other terminal of resistance 63 being connected to a circuit point 160. A capacitor 64 is connected between point 160 and the input 57 of amplifier 60 and another capacitor 65 is connected between circuit point 160 and ground.

A resistance 66 is connected between point 160 and circuit point 67. Circuit point 160 is also connected to a non-inverting input 43 of an amplifier 44 which has an output 45 and an inverting input 46. Inverting input 43 is connected through a resistance 47 to output 45 in voltage-follower configuration. The output 45 of amplifier 44 is connected via switch 5 to circuit point 3.

The collector of transistor 34 is connected to a load resistance 73 and to the base of transistor 74. Transistor 74 has a collector 75 to which is connected a load resistance 76. It will be appreciated that the amplifier 11 together with its input resistor 4 and capacitor 14 constitute an integrator capable of operating in a parallel feedback mode, to integrate signals applied at circuit point 3 via switch 2 when the non-inverting input 13 is connected via switch 70 to signal ground, or, in a series feedback mode, to integrate signals applied via switch 150 to the non-inverting input 13 when circuit point 3 is connected to ground via switch 8.

The resistance 152 may be connected across capacitor 14 by application of an enabling signal at point 154 from sequence controller 82 to close switch 153 and thereby to allow capacitor 14 to be discharged rapidly. Amplifiers 17 and 27 and the transistor pair 34 and 35 constitute a comparator responsive to differences of potential between the output 12 of the integrator 11 and ground.

Amplifiers 52 and 60 and their associated components and switches provide a feedback loop for correction of drift. Amplifier 44 with switch 5 provides a means of impressing on circuit point 3 any voltage change at circuit point 160.

The collector 75 of transistor 74 is connected to one input of an AND-gate 80, another input 81 of which is connected to a sequence controller 82. The output of the AND-gate 80 is connected to the set input of bistable 83, the reset input 84 of which is connected to the sequence controller 82. Signals from the set and reset outputs of bistable 83 at circuit points 85 and 86 respectively are also connected to the sequence controller to provide, as will be seen, signals representative of the polarity of the input signal for control of the measurement cycle.

The collector 75 is also connected to the respective inputs of an inverter 87, and a delay 90, and to one input of a 3 input AND-gate 91. The output of delay 90 is connected to inverter 92 and to one input of a 3-input AND-gate 93, another input of which is connected to the output of inverter 87. The output of a clock pulse generator 94 is connected to inputs of gates 91 and 93; the third gate of gate 92 is connected to the output of inverter 92. The delay introduced by delay 90 is longer than the period between successive pulses from clock pulse generator 94, so it will be seen that when the level at the output of the comparator, that is to say at collector 75, changes from 0 to 1 or from 1 to 0 a signal will appear at the output of gate 91 or gate 93 respectively, with the occurrence of the first clock pulse after the change.

The outputs of AND-gates 91 and 93 are connected respectively to two inputs of a 3-input OR-gate 97 the output of which is connected to the set input of bistable 95. The reset input 96 of bistable 95 is connected to the sequence controller 82. The set output of bistable 95 is connected to the sequence controller at point 132 and the reset output is connected to one input of a 3-input AND-gate 100 and also to one input of 3-input AND-gate 101. A second input of gate 100 and a second input of gate 101 are connected to receive pulses from clock pulse generator 94 and the third inputs of gates 100 and 101 are connected respectively to the set and reset outputs of a bistable 102. Bistable 102 is set and reset by signals on control lines 104 and 103 respectively from sequence controller 82.

The output of gate 101 is connected to a terminal 105 of a counter 106. Counter 106 is a bi-directional counter having four decade stages in cascade and arranged to count up by increments of 10 in response to pulses at a terminal 105 of least-significant-but-one decade and to count down units in response to pulses at a terminal 107 of the least significant decade. When the counter 106 has reached its full complement, 9999, the next pulse at terminal 105 causes a carry pulse to appear at a "carry" terminal 108 and the contents of the counter are re-set to 0000. The counter may also be reset to 0000 by a pulse from the sequence controller 82 on a control line 109.

The carry output at terminal 108 is connected to the third input of three input OR-gate 97. Individual decade stages within the counter are connected in known fashion through AND-gates 110 (not all shown, in interests of clarity) to a staticiser register decoder and display unit 111. The gates 110 are also all connected to receive a signal from the sequence controller on control line 112 so that a signal on 112 opens the gate to allow parallel transfer of the contents of counter 106 into the staticiser register 111.

A polarity staticiser and display 113, for displaying the polarity of the input signal, is connected to the output 114 of a two input AND-gate 115, the inputs whereof are respectively connected to control line 112 and the reset output 86 of bistable 83.

It will be appreciated that sequence controller 82 not only holds the logic for progressing from one phase of the measurement cycle to the next, as will be described, but also for providing signals to open and close gates and to set and reset bistables etc. during these various phases of the cycle. Accordingly, control signals are provided by the sequence controller 82 to the various switches as follows:

to switch 2 on control line 121
to switch 8 on 122
to switch 7 on 123
to switch 6 on 124
to switch 5 on 125
to switch 150 on 151
to switch 153 on 154
to switch 70 on 128
to switch 56 on 129

One pole of each of switches 6, 7 and 8 is connected to the common point 3; the other poles are connected respectively to a first source of negative reference voltge $V_1$ at point 130, to a second source of positive reference voltage $V_2$ at point 131, and to ground. The magnitude of $V_1$ is ten times that of $V_2$.

Switches 70 and 150 similarly each have one pole connected to common point 67 and their other poles connected respectively to ground and to the input terminal 1.

It will be appreciated that although the symbol for a junction transistor is shown for switches 2, 6, 7 etc., insulated gate of bipolar transistors or other suitable switches, not excluding mechanical switches, may be selected for each application according to the performance required and the preferred manufacturing technology.

The measurement cycle will now be explained with reference to FIGS. 1 and 2 which shows in FIG. 2a the signal at the output 12 of the integrator 11 in the course of measuring a positive input signal, and, in FIG. 2b, the voltage at point 12 in the course of a cycle measuring a negative input voltage. In the interests of clarity the horizontal axis or time of FIGS. 2 is non linear and has been expanded in respect of the intervals shown as $t_2$, $t_3$, $t_4$, $t_6$ and $t_8$ in relation to $t_1$, $t_5$, $t_7$ and $t_9$.

The measuring cycle is in each case divided into ten phases marked by signals from sequence controller 82. During the first 3 phases, $t_1$, $t_2$, $t_3$, the polarity of the input signal is determined by applying it to the integrator for a timed period and then testing its polarity. The integrating capacitor 14 is discharged before the next phase.

Second, third and fourth ramps follow during which successively the input signal is integrated and the integrating capacitor discharged by application of reference signals.

Finally, the measurement is staticised, drift correction is effected and the circuits are re-set for the next cycle. Immediately before the beginning of the measurement cycle switches 8 and 70 are closed by means of potentials applied by the sequence controller on lines 122 and 128 respectively but all other switches are open. Bistable 102 and 83 have been re-set by means of signals at 103 and 84, bistable 95 has been set at the end of the previous cycle.

At the beginning of the first phase $t_1$ the sequence controller 82 provides a signal on line 99 to re-set bistable 95, at point 128 to close switch 70 and, at point 121, to close switch 2. Simultaneously the enabling signal on line 122 holding switch 8 closed is removed so the point 3 is now connected to the input signal. Pulses from clock pulse generator 94 pass through gate 101, enabled by the re-setting of bistable 102 and 95, into terminal 105 of counter 106.

This state will continue until a carry bit at terminal 108 passing through OR gate 97 sets bistable 95 thereby removing one of the enabling signals at gate 101. At the same time the change at point 132 passes to the sequence controller marking the end of phase 1. The enabling signal is removed from point 121 and restored to point 122, thereby opening switch 2 and closing switch 8 to connect the input point 3 to ground.

By a suitable choice of frequency of clock pulse generator 94 and the "full house" count of counter 106, phase 1 may be made a convenient period, for example 100 milliseconds.

During this first phase an input signal applied to terminal 1 is integrated for a fixed period of time to charge capacitor 14; the output 12 of the integrator will ramp negatively if the input signal is positive (FIG. 2a) or positively if the input signal is negative (FIG. 2b).

At the end of the period $t_1$ the polarity at point 12 is determined by means of the comparator 17, 27, 34 and 35. After a brief time interval $t_2$ to allow transients to settle, an enabling signal from sequence controller 82 at point 81 tests the output at point 75, if the output of gate 80 is "1" the bistable 83 will be set, but if it was "0" the bistable 83 will remain re-set. It will be seen that a positive input signal at point 1 will provide a "0" at point 75 and so leave the bistable 83 re-set.

During the period $t_2$ and $t_3$ the switch 2 is opened and the switch 8 is closed, thereby grounding the circuit point 3. During the period $t_3$ capacitor 14 is restored to its initial condition of zero charge by closing switch 153 by means of an enabling voltage at point 154 from sequence controller 82, whereupon capacitor 14 discharges through resistance 152. This is seen in FIG. 2 as an exponential return to zero.

A further interval $t_4$ follows $t_3$. $t_4$ is redundant when a positive input voltage is measured but is needed, as will be explained, when a negative voltage is to be measured.

If the input voltage is positive, switches 70 and 8 are closed during $t_4$, thereby connecting circuit points 3 and 67 to ground.

If the input voltage is negative, switches 150 and 5 are closed during $t_4$, thereby connecting the input signal at 1 to circuit point 67. The potential at point 160 falls exponentially, due to the filtering action of resistor 66 and capacitor 65, and is impressed on circuit point 3 by means of the voltage follower 44 through switch 5.

As a result of this filtering action the rate of change of voltage applied to the two differential inputs 10 and 13 of amplifier 11 is reduced so that there is not change in the charge on the capacitor 14 as a result of the change in level of the input point 13 from ground to that of the input signal. The period $t_4$ must be much longer than the time constant of the filter formed by resistance 66 and capacitance 65 to allow the potential at point 13 substantially to reach that of point 67. Because the change in potential has been applied to the non-inverting input 13 of amplifier 11 as well as to common point 3 there will be a change in the output of the integrator 11 at point 12 following that applied to point 13; this is illustrated in FIG. 2b.

During the period $t_5$, the input signal is again applied to the integrator for a timed period so as to charge the capacitor 14. If the input signal is positive switches 70 and 2 are closed, thereby connecting circuit point 3 to the input signal.

If the input signal is negative, the enabling signal at point 125 is removed, thereby opening switch 5 and at the same time switch 8 is closed by the application of an enabling signal at point 121 so as to connect circuit point 3 to ground.

During $t_5$ the output 12 ramps down as shown in FIG. 2 and the end of $t_5$ is marked, as was the end of $t_1$, by a signal from bistable 95 at point 132.

$t_6$, like $t_4$, provides a settling time during which the input signal, if negative, may be removed gradually from the inputs of amplifier 11. If the input signal is negative switches 70 and 5 and closed during $t_6$ so that circuit point 160 and, with it, inputs 10 and 13 to amplifier 11 return exponentially to ground potential. If the input signal is positive, switches 8 and 70 are closed during $t_6$.

Removal of a negative input signal from the non-inverting input 13 of amplifier 11 means that the output of amplifier 11 is, at the end of period $t_6$, at the same negative potential for a given magnitude of input signal, whether that input signal was positive or negative. Accordingly the remainder of the measurement cycle, during which the capacitor 14 is discharged by successive application of a first negative and a second, smaller, positive reference potential, proceeds in the same known manner, whether the input signal is positive or negative.

At the beginning of interval $t_7$ the enabling voltage is removed by the sequence controller from point 122 and applied instead to point 124 thereby opening switch 8 and closing switch 6. At the same time enbling voltage is restored to point 96 to re-set bistable 95 and once again admit clock pulses from clock pulse generator 94 through gate 101 and terminal 105 into the counter 106.

The application of the negative voltage $V_1$ at point 130 to the input 3 causes the output of the integrator at point 12 to start to ramp upwards back towards zero as shown in FIG. 2. As the output of the integrator passes through zero so the voltage at point 75 changes from 0 to 1. The signal at the output of delay 90, inverted by inverter 92, will remain positive for a short time after the change so that, with the next pulse from clock pulse generator 94, all three inputs to gate 91 are enabled and an output signal sets bistable 95. This removes the enabling signal from gate 101, and a signal from the set output of bistable 95 to the sequence controller at 132 disables the signal at point 124 to open switch 6, and provides signals at point 122 to close switch 8 and, to point 104, to set bistable 102. A further time delay $t_8$, equal in length to delay $t_3$, is initiated.

It will be seen that as the period $t_7$ does not end until the first clock pulse after the potential at point 12 passes through zero, so there would normally be a small overshoot which is removed by application of a second, lesser, positive reference voltage.

After the delay $t_8$, the second reference voltage $V_2$ is applied during $t_9$ by opening switch 8 and closing switch 7. At the same time a signal to point 96 re-sets bistable 95. Since bistable 102 has been set, clock pulses will pass through gate 100 into the "units" stage of counter 106 for subtraction from the number, an integral count of tens, counted up during the application of of the first reference voltage $V_1$ during $t_7$. It will be appreciated that the relative significance accorded to clock pulses during $t_7$ and $t_9$ corresponds to the relative magnitude of $V_1$ and $V_2$. The output of the integrator at point 12 will now ramp negatively until it passes through zero, at which point the comparator will signal a voltage change from positive to negative. This will provide a "1" at the output of inverter 87, a delayed "1" at the output of delay 90 and accordingly gate 93 will open on the next clock pulse from clock pulse generator 94 passing through AND-gate 97 to set bistable 95. This removes the enabling voltage from gate 100 and so stops the flow of clock pulses at terminal 107 to counter 106.

The number in counter 106 at the end of $t_9$ is dependent upon the time taken to discharge completely the charge acquired by capacitor 14 from the input signal to be measured at point 1 during the time period $t_5$.

A signal from the set output 132 of bistable 95 into the sequence controller marks the end of $t_9$. The enabling voltage is removed from point 123 and applied to point 122 so that point 3 is now grounded. After the end of $t_9$ during $t_{10}$ the contents of the counter 106 are transferred into a staticiser register 11 by means of an enabling signal at point 112 applied to gates 110. The same signal at 112 opens gate 115 if bistable 83 was re-set, thereby entering a plus sign in staticiser 113 if the input signal was positive.

At the end of period $t_{10}$, which is of the same duration as $t_3$ and $t_5$, the counter 106 is restored to zero by signal from the sequence controller on line 109.

The final stage in the cycle is drift correction, wherein an enabling voltage is applied to point 129 to close switch 56 so that any voltage at the input of amplifier 52 is amplified, inverted and applied through resistance 55 to capacitor 64. Amplifier 60 presents a high input impedance to capacitor 64 so that its output remains constant during the following cycle. A proportion of the output voltage from amplifier 60 appears across resistance 63 and is applied to the non-inverting input of amplifier 11. It will be seen that the action of the drift correction loop is to sample the voltage at point 30 during each cycle and to charge the capacitor 64 so as to counteract the drift at point 30.

What is claimed is:

1. An integrating analog-to-digital converter for producing a digital output signal representative of the magnitude of an analog input voltage, the converter comprising:
    an input terminal for receiving the analog input voltage;
    integrating means comprising a differential amplifier having an inverting input, a non-inverting input and an output, and an integrating capacitance negative-feedback connected between the output and the inverting input;
    polarity testing means connected to said integrating means for receiving a signal representative of the voltage across said capacitance and responsive thereto to produce an output signal having a first level representative of one polarity of the voltage across said capacitance and a second level representative of the other polarity of the voltage across the capacitance;
    first switch means for coupling the input terminal to one of said inputs of said differential amplifier during a first time interval to charge said capacitance to a voltage whose polarity is dependent upon the polarity of the analog input voltage,
        said first switch means being responsive to the output signal produced by said polarity testing means at the end of the first time interval to discharge said capacitance and to couple said input terminal to a predetermined one of said inputs of said differential amplifier during a second time interval when the analog input voltage is of one polarity, to charge said capacitance to a voltage of predetermined polarity whose magnitude is dependent on the magnitude of the analog input voltage,
        and to couple said input terminal to the other input of said differential amplifier and temporarily to said predetermined one of said inputs when the analog input voltage is of the other polarity to slew the respective voltages at both inputs and at the output of the differential amplifier by an amount equal to the analog input voltage, while preserving the voltage across said capacitance substantially unchanged, and to subsequently charge said capacitance during said second time interval to a voltage of said predetermined polarity whose magnitude is dependent upon the magnitude of the analog input voltage;
    a source of at least one reference voltage of predetermined polarity;
    second switch means for coupling said source of reference voltage to a preselected input of said differential amplifier, regardless of the polarity of the analog input signal, during a third time interval to discharge said capacitance, the end of the third time interval being indicated by a change in the output signal produced by said polarity testing means from one level to the other;
    a source of clock pulses; and
    pulse counter means for counting the clock pulses from said source during the third time interval to produce a digital output signal representative of the magnitude of the analog input signal.

2. A converter according to claim 1, wherein said one of said inputs, said predetermined input and said preselected input of the differential amplifier are all constituted by the inverting input of said differential amplifier.

3. A converter according to claim 2, wherein said first switch means includes a voltage follower amplifier for effecting said temporary coupling of the input terminal to the inverting input of the differential amplifier.

4. A converter according to claim 3, and further comprising a low pass filter connected in series between the input terminal and both the non-inverting input of the differential amplifier and the voltage follower amplifier, whereby the rate of change of voltage at the respective inputs of the differential amplifier in response to a step voltage change at the input of the filter does not exceed the maximum slew rate of the differential amplifier.

5. A converter according to claim 1 and further comprising timing means for controlling said first switch means such that at least the second time interval is of substantially predetermined duration.

6. A converter according to claim 5, wherein said timing means further controls said first switch means such that the first time interval is also of substantially prdetermined duration.

7. A converter according to claim 2, wherein said polarity testing means comprises a voltage comparator having first and second inputs respectively coupled to the non-inverting input and the output of the differential amplifier.

* * * * *

PO-1050
(5/69)

UNITED STATES PATENT OFFICE
CERTIFICATE OF CORRECTION

Patent No. 3,943,506  Dated March 9, 1976

Inventor(s) Richard Challinor Peattie

It is certified that error appears in the above-identified patent and that said Letters Patent are hereby corrected as shown below:

IN THE HEADING:

Insert:

-- 30  Foreign Application Data

December 22, 1972  Great Britain 59362/72 --

Signed and Sealed this

Tenth Day of August 1976

[SEAL]

Attest:

RUTH C. MASON
*Attesting Officer*

C. MARSHALL DANN
*Commissioner of Patents and Trademarks*